US006487078B2

(12) United States Patent
Kledzik et al.

(10) Patent No.: US 6,487,078 B2
(45) Date of Patent: Nov. 26, 2002

(54) ELECTRONIC MODULE HAVING A THREE DIMENSIONAL ARRAY OF CARRIER-MOUNTED INTEGRATED CIRCUIT PACKAGES

(75) Inventors: Kenneth J. Kledzik, San Clemente, CA (US); Jason C. Engle, San Clemente, CA (US)

(73) Assignee: Legacy Electronics, Inc., San Clemente, CA (US)

( * ) Notice: Subject to any disclaimer, the term of this patent is extended or adjusted under 35 U.S.C. 154(b) by 0 days.

(21) Appl. No.: 09/524,324

(22) Filed: Mar. 13, 2000

(65) Prior Publication Data

US 2002/0135982 A1 Sep. 26, 2002

(51) Int. Cl.$^7$ ................................................. H05H 7/20
(52) U.S. Cl. ...................... 361/704; 165/80.2; 165/80.3; 165/185; 174/252; 174/255; 174/264; 174/16.3; 174/266; 257/668; 257/686; 257/696; 257/698; 257/675; 257/707; 257/777; 361/707; 361/710; 361/735; 361/744; 361/723; 361/767; 361/760; 361/813; 361/807; 361/809; 361/774
(58) Field of Search ............................. 165/80.2, 80.3, 165/185; 174/16.3, 52.1, 52.4, 52.5, 252, 264–266, 255; 257/668–669, 675, 686, 690–693, 696–698, 701–707, 712–713, 723–724, 737–738, 747, 777, 796; 361/704, 707, 710, 715, 723, 733–735, 744, 753, 767, 783, 760, 772–774, 813, 803, 807–809, 811, 719–721; 438/122, 123; 29/832, 827; 439/69, 485, 487

(56) References Cited

U.S. PATENT DOCUMENTS 4,437,235 A  3/1984  McIver (List continued on next page.)

FOREIGN PATENT DOCUMENTS

| JP | 00031617 | 1/2000 |
|---|---|---|
| WO | PCT/US00/04988 | 1/2000 |

OTHER PUBLICATIONS

Notification of Transmittal of the International Search Report on Int'l App. #PCT/US01/07926 (PCT App. is same as pending application from which it claims priority.)

Primary Examiner—Gregory Thompson
(74) Attorney, Agent, or Firm—Randall L. Reed; Levin and Hawes, LLP

(57) ABSTRACT

An improved multi-chip module includes a main circuit board having an array of electrical interconnection pads to which are mounted a plurality of IC package units. Each IC package unit includes a pair of IC packages, both of which are mounted on opposite sides of a package carrier. The package units may be mounted on one or both sides of the main circuit board. A first primary embodiment of the invention employs a laminar package carrier having a pair of major planar surfaces. Each planar surface incorporates electrical contact pads. One IC package is surface mounted on each major planar surface, by interconnecting the leads of the package with the contact pads on the planar surface, to form the IC package unit. A second primary embodiment of the invention utilizes a carrier substrate which has a pair of recesses for back-to-back surface mounting of the IC package pair. The two IC packages may be in contact with opposite sides of a heat sink layer embedded within the carrier substrate. Each resulting IC package unit is surface mounted to the main circuit board. A third primary embodiment of the invention incorporates features of both the first and second primary embodiments. One of the packages is mounted on a planar surface of the carrier rightside up, while the other package is mounted on the carrier in a recess upside down. Several variants of this embodiment are possible. Either the IC package that is mounted on the planar surface of the carrier, or the IC package that is mounted within the recess, may be mounted adjacent to the main circuit board. In the former case, the adjacent package of the package unit fits within a recess on the main circuit board. In the latter case, the adjacent package of the package unit mounts on a planar surface of the main circuit board. For any of the three primary main embodiments, the carrier may be equipped with its own set of interconnection leads which interface with the interconnection pads on the main circuit board or connection may be made directly between the leads of one package and the interconnection pads of the circuit board.

47 Claims, 6 Drawing Sheets

U.S. PATENT DOCUMENTS

| | | | |
|---|---|---|---|
| 5,138,438 A | * | 8/1992 | Masayuki et al. ........... 257/686 |
| 5,239,198 A | * | 8/1993 | Lin et al. .................... 257/693 |
| 5,239,447 A | | 8/1993 | Cotues et al. |
| 5,311,401 A | | 5/1994 | Gates, Jr. et al. |
| 5,514,907 A | | 5/1996 | Moshayedi |
| 5,729,438 A | * | 3/1998 | Pieper et al. ................ 361/760 |
| 5,742,097 A | | 4/1998 | Matsunaga et al. |
| 5,744,827 A | | 4/1998 | Jeong et al. |
| 5,744,862 A | * | 4/1998 | Ishii ........................... 257/693 |
| 5,754,408 A | * | 5/1998 | Derouiche .................. 361/773 |
| 5,910,885 A | | 6/1999 | Gulachenski et al. |
| 6,014,316 A | | 1/2000 | Edie |
| 6,028,352 A | | 2/2000 | Edie |
| 6,084,293 A | | 7/2000 | Ohuchi |
| 6,084,780 A | | 7/2000 | Happoya |
| RE36,916 E | | 10/2000 | Moshayedi |

* cited by examiner

ELECTRONIC MODULE HAVING A THREE DIMENSIONAL ARRAY OF CARRIER-MOUNTED INTEGRATED CIRCUIT PACKAGES

This invention is related to U.S. patent application Ser. No. 09/285,354, which was filed on Apr. 2, 1999, and which is titled ELECTRONIC MODULE HAVING A THREE DIMENSIONAL ARRAY OF INTEGRATED CIRCUIT PACKAGES.

FIELD OF THE INVENTION

This invention relates to the production of multi-chip electronic modules, and more particularly to a method and apparatus for attaching multiple integrated circuit packages to printed circuit boards. It also relates to high-density memory modules having three-dimensional arrangements of integrated circuit packages.

BACKGROUND OF THE INVENTION

Demand for semiconductor memory is highly elastic. On one hand, when such memory is relatively inexpensive compared to the overall cost of a computer system, an almost unsatiable demand results, with computer manufacturers tending to install an amount of main memory in each system that greatly exceeds the amount required for average program use. On the other hand, when it is costly, manufacturers typically install an amount in each system that only marginally fulfills the requirement of the average program. Although the sales prices of computers may, thus, be maintained at low levels, the end user may soon find that he must upgrade his computer's main memory.

The ever increasing demand for large random access computer memories, and the growing demand for increasingly compact computers, coupled with an incentive on the part of the semiconductor manufacturers to reduce the cost per bit, has lead to not only a quadrupling of circuit density approximately every three years, but to increasingly efficient techniques for packaging and mounting the circuit chips. Up until the late 1980's, semiconductor memory chips were usually packaged as dual in-line pin packages (DIPPs). The pins of these DIPP packages were generally soldered directly within through-holes in a main circuit board (e.g., the motherboard), or they were inserted in sockets which were, in turn, soldered within through-holes in the main circuit board. With the advent of surface mount technology, conventional plated through-holes on printed circuit boards have been replaced with conductive mounting pads. Small Outline J-lead (SOJ) packages have lead to Thin Small Outline Packages (TSOPs). Because the pitch or spacing between centers of adjacent surface mount pins is significantly less than the conventional 0.10-inch spacing for conventional through-hole components, surface mount chips tend to be considerably smaller than corresponding conventional chips, thus taking up less space on a printed circuit board. Additionally, as through holes are no longer needed, surface mount technology lends itself to the mounting of components on both sides of a printed circuit board. Memory modules utilizing surface-mount packages on both sides have become the standard. Both the earlier single in-line memory modules (SIMMs) and the currently used dual in-line memory modules (DIMMs) are inserted into sockets on the motherboard.

Packaging density may be increased rather dramatically fabricating modules in which a plurality of integrated circuit (IC) chips, such as memory chips, are stacked in a three dimensional arrangement. As a general rule, the three-dimensional stacking of chips requires complex, non-standard packaging methods.

One example of a vertical stack of IC chips is provided by U.S. Pat. No. 4,956,694 to Floyd Eide, titled INTEGRATED CIRCUIT CHIP STACKING. A plurality of integrated circuits are packaged within package carriers and stacked, one on top of the other, on a printed circuit board. Except for the chip select terminal, all other like terminals on the chips are connected in parallel.

Another example of chip stacking is given in U.S. Pat. No. 5,128,831 to Fox, et al. titled HIGH-DENSITY ELECTRONIC PACKAGE COMPRISING STACKED SUB-MODULES WHICH ARE ELECTRICALLY INTERCONNECTED BY SOLDER-FILLED VIAS. The package is assembled from individually testable sub-modules, each of which has a single chip bonded thereto. The sub-modules are interleaved with frame-like spacers. Both the sub-modules and the spacers have alignable vias which provide interconnection between the various sub-modules.

U.S. Pat. No. 5,313,096, also issued to Floyd Eide and titled IC CHIP PACKAGE HAVING CHIP ATTACHED TO AND WIRE BONDED WITHIN AN OVERLYING SUBSTRATE, is another example. Such a package includes a chip having an upper active surface bonded to the lower surface of a lower substrate layer having conductive traces on its upper surface which terminate in conductive pads on its periphery. Connection between terminals on the active surface and the traces is made with wire bonds through apertures within the lower substrate layer. An upper substrate layer, which is bonded to the lower substrate layer, has apertures which coincide with those of the lower substrate layer and provide space in which the wire bonding may occur. After wire bonding has occurred, the apertures are filled with epoxy to form an individually testable sub-module. Multiple sub-modules can be stacked and interconnected with metal strips attached to their edges.

A final example of a stacked-chip module is disclosed in U.S. Pat. No. 5,869,353 to A. U. Levy, et al. titled MODULAR PANEL STACKING PROCESS. A plurality of panels are fabricated having apertures therein, an array of chip-mounting pads at the bottom of the apertures, and interfacing conductive pads. Both the chip-mounting pads and the interfacing conductive pads are coated with solder paste. Plastic-encapsulated surface-mount IC chips are positioned on the paste-covered mounting pads, multiple panels are stacked in a layered arrangement and the stack is heated to solder the chip leads to the mounting pads and the interfacing pads of adjacent panels together. Individual chip package stacks are then separated from the panel stack by a cutting and cleaving operation.

As can be seen by the foregoing examples, increased chip density is achieved through the use of complicated packaging and stacking arrangements, which must necessarily be reflected in a higher cost per bit of storage.

SUMMARY OF THE INVENTION

The present invention provides for increased circuit density on printed circuit boards. The invention is particularly useful for increasing the density of memory chips on memory modules used for computer systems. The invention includes a package carrier that is designed to mount on a printed circuit board (PCB) on top of a first integrated circuit (IC) package that is also mounted on the PCB. The carrier has an upper major surface having a pad array on which a second IC package is mountable. When mounted on top of the first IC package, the carrier may be thought of as a canopy, on top of which the second. IC package is mounted. The carrier has a plurality of leads by means of which the carrier is surface mounted to the PCB. Each carrier lead is also electrically connected to a single pad of the pad array on the upper surface. The invention also includes a multi-chip module assembled using at least one PCB, at least one package carrier and at least two IC packages for each carrier. For multi-chip modules where the IC package beneath the carrier shares all or most connections in common with the IC package mounted thereupon, a single lead of the carrier and a single lead of the package beneath the carrier may share a mounting/connection pad on the PCB. When separate connections must be made by similarly positioned leads on the carrier and the package beneath the carrier, the corresponding pad on the PCB may be split so that each lead has a unique connection.

A first embodiment of the carrier includes a body having a first pad array, arranged as two parallel linear rows of pads, and adhered to an upper major surface thereof. The leads of an IC package may be conductively bonded to the pads of the first pad array. The body also has a second pad array, arranged as two parallel linear rows of pads positioned along the longitudinal edges, and adhered to the lower major surface thereof. Pads of the first and second arrays are interconnected with conductively-plated vias, or through holes. The carrier leads are conductively bonded to the pads of the second array. The carrier incorporates a heat sink feature. The end leads on a first side of the carrier are both power leads. These two power leads are interconnected by a first laminar sheet which is continuous with and extends between those two leads, and which may extend the entire length of the carrier. An end portion of the first laminar sheet may be exposed at each end of the carrier to facilitate the transfer of heat to the ambient air. The end leads on a second side of the carrier are both ground leads. These two ground leads are interconnected by a second laminar sheet which is continuous with and extends between these two leads, and which may extend the entire length of the carrier. An end portion of the second laminar sheet may be exposed at each end of the carrier to facilitate the transfer of heat to the ambient air. Each laminar sheet is spaced apart from the intervening leads of the same row. The first and second laminar sheets are spaced apart from one another along the center of the carrier. Each IC package includes a dielectric body, an IC chip embedded within the body, and a plurality of leads, an end of each of which is also embedded within the body and electrically conductively coupled to a connection terminal on the IC chip. For a preferred embodiment of the multi-chip module, an upper surface of the body of the lower IC package is either in intimate contact with both laminar sheets, or thermally coupled thereto via a thermally-conductive compound, or in close proximity thereto to facilitate heat transfer from the package body to the laminar sheets.

A second embodiment of the carrier includes modified leads, each of which functions as a heat sink. A center portion of each lead is bonded to a pad of the second pad array on lower surface of the carrier body. An outer portion of each lead is shaped for surface mounting to a mounting/connection pad on a PCB. An inner portion of each lead extends toward the center of the body. For a preferred embodiment of the multi-chip module, an upper surface of the body of the lower IC package is either in intimate contact with the inner portion of each lead, or thermally coupled thereto via a thermally-conductive compound, or in close proximity thereto to facilitate heat transfer from the package body to the leads.

DETAILED DESCRIPTION OF THE INVENTION

As will be evident from the attached drawing figures, the present invention permits the manufacture of electronic modules having increased circuit density. The invention may be used for a variety of applications. One very obvious usage is in the manufacture of memory modules. As memory modules typically incorporate a printed circuit board having rigidly prescribed dimensions, more efficient use of the board real estate will result in a module having greater total memory capacity. The invention may also be utilized to closely couple related, but dissimilar, IC packages. For example, it may be desirable to mount an IC package containing high-speed cache memory on top of an IC package containing a microprocessor chip. The various embodiments of the improved electronic module will now be described in detail with reference to the accompanying drawings.

Figure 1:
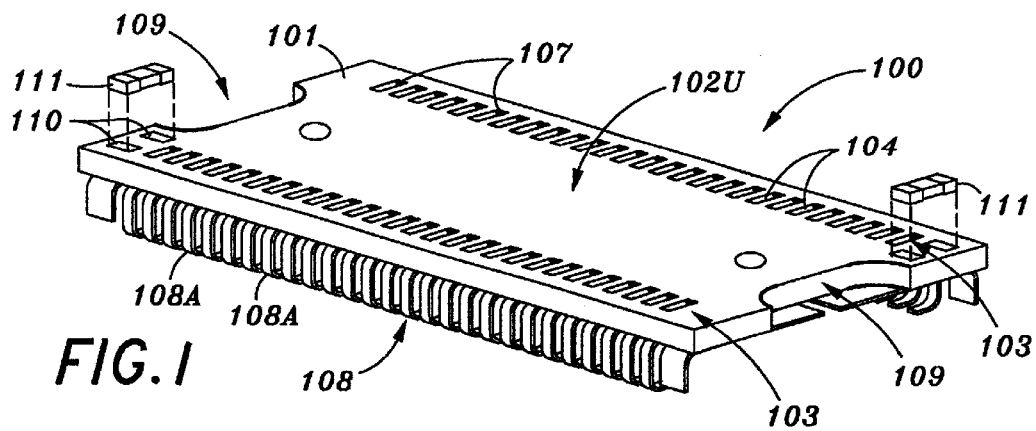
FIG. 1 is an isometric view of a first embodiment package carrier.
Figure 2:
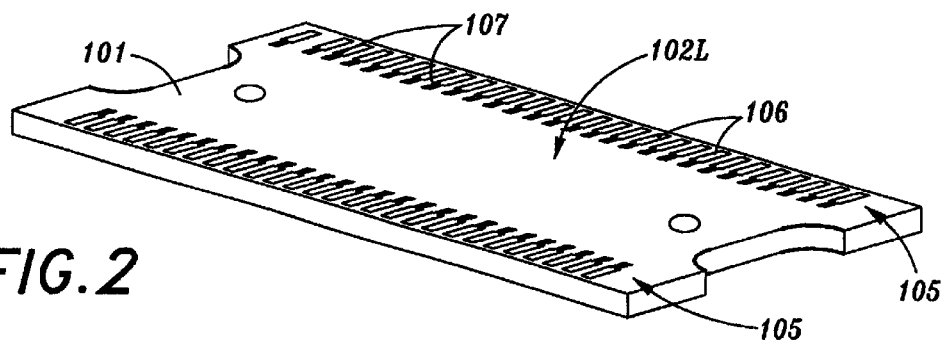
FIG. 2 is an isometric view of the first embodiment package carrier body, showing the underside thereof.

Referring now to FIGS. 1 and 2, a first embodiment package carrier 100 has a dielectric body 101 having upper and Lower parallel major planar surfaces 102U and 102L, respectively. For a preferred embodiment of the invention, the body is made from the fiberglass-reinforced plastic material commonly used to manufacture printed circuit boards. The dielectric body 101 also has a first mounting, pad array 103 affixed to said upper major planar surface 102U. The mounting pads 104 of the array 103 are individually shaped and collectively arrayed to receive the leads of a first integrated circuit package (not shown in this drawing figure). The dielectric body 101 also includes a second mounting pad array 105 affixed to said lower major planar surface 102L. Each pad 106 of the second array 105 is coupled to a pad 104 of said first array 103 by means of an internally plated aperture 107 which extends between the upper major planar surface 102U and the lower major surface 102L. The package carrier 100 also includes a set of carrier leads 108, each of which is conductively bonded to a pad 106 of the second mounting pad array 105. The individual leads 108A of the carrier lead set 108 are spaced and configured for surface mounting on a printed circuit board (not shown in this drawing figure). It will be noted that the body 101 has a cutout 109 at each end thereof. It will also be noted that for this embodiment of a carrier, the spacing between the two rows of pads 104 of the first array 103 is narrower than the spacing between the two rows of pads 105 of the second array. The reason for this difference in spacing is that the package carrier 100 may be thought of as a cover which overlies and bridges a second integrated circuit package mounted on the printed circuit board. Thus, the carrier leads 108 must be wider spaced so that they mount outside of the leads of the package so covered. The package carrier 100 also includes a pair of capacitor mounting pads 110 at each end thereof. The pads of each pair are sized and spaced to receive a surface mount decoupling capacitor 111.

Figure 3:
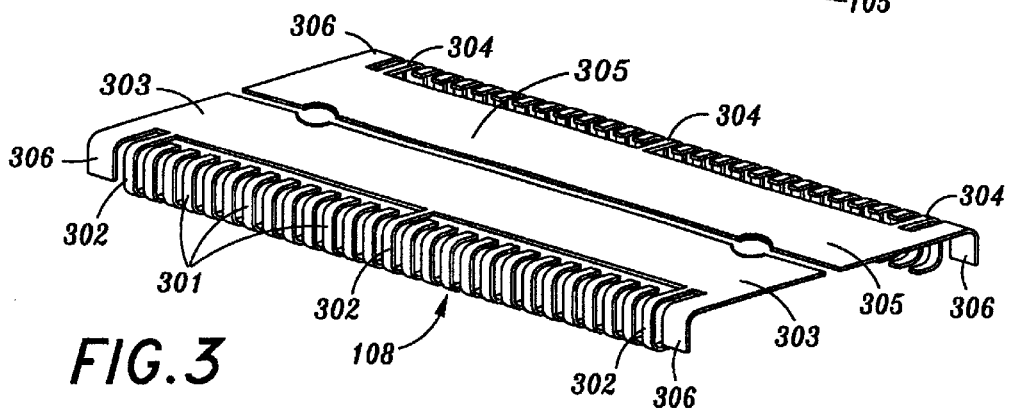
FIG. 3 is an isometric view of the carrier leads of the package carrier of FIG. 1.

Referring now to FIG. 3, the carrier lead set 108 of the first embodiment package carrier 100 includes a plurality of articulated leads 301, each of which is individually attached to a pad 106 of the second mounting pad array 105. The outer portion of each of the leads 301 is essentially C-shaped. The carrier lead set 108 also includes a trio of power leads 302, which are interconnected via a first laminar sheet 303, which also serves as a heat sink layer. Also included in the carrier lead set 108 is a trio of ground leads 304, which are interconnected via a second laminar sheet 305, which also serves as a heat sink layer. Both the first and second laminar sheets 303 and 305, respectively, incorporate a pair of extension tabs 306, which enhance heat dissipation from the laminar sheets. The cutouts 109 expose portions of the first and second Laminar sheets 103 and 305, thereby aiding in heat dissipation to the ambient air.

Figure 4:
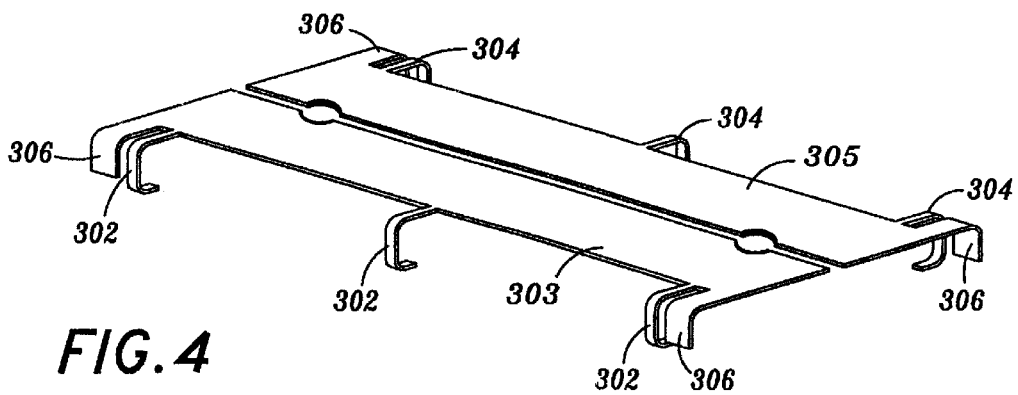
FIG. 4 is an isometric view of the first and second heat sink sheets, which are connected to the ground leads and the power leads, respectively.

FIG. 4 shows the carrier lead set 108 minus all articulated leads 301. The three power leads 302 and associated interconnected heat sink layer 303 are on the left, while the three ground leads 304 and associated interconnected heat sink layer 305 are on the right. The extension tabs 306 are also readily visible.

Figure 5:
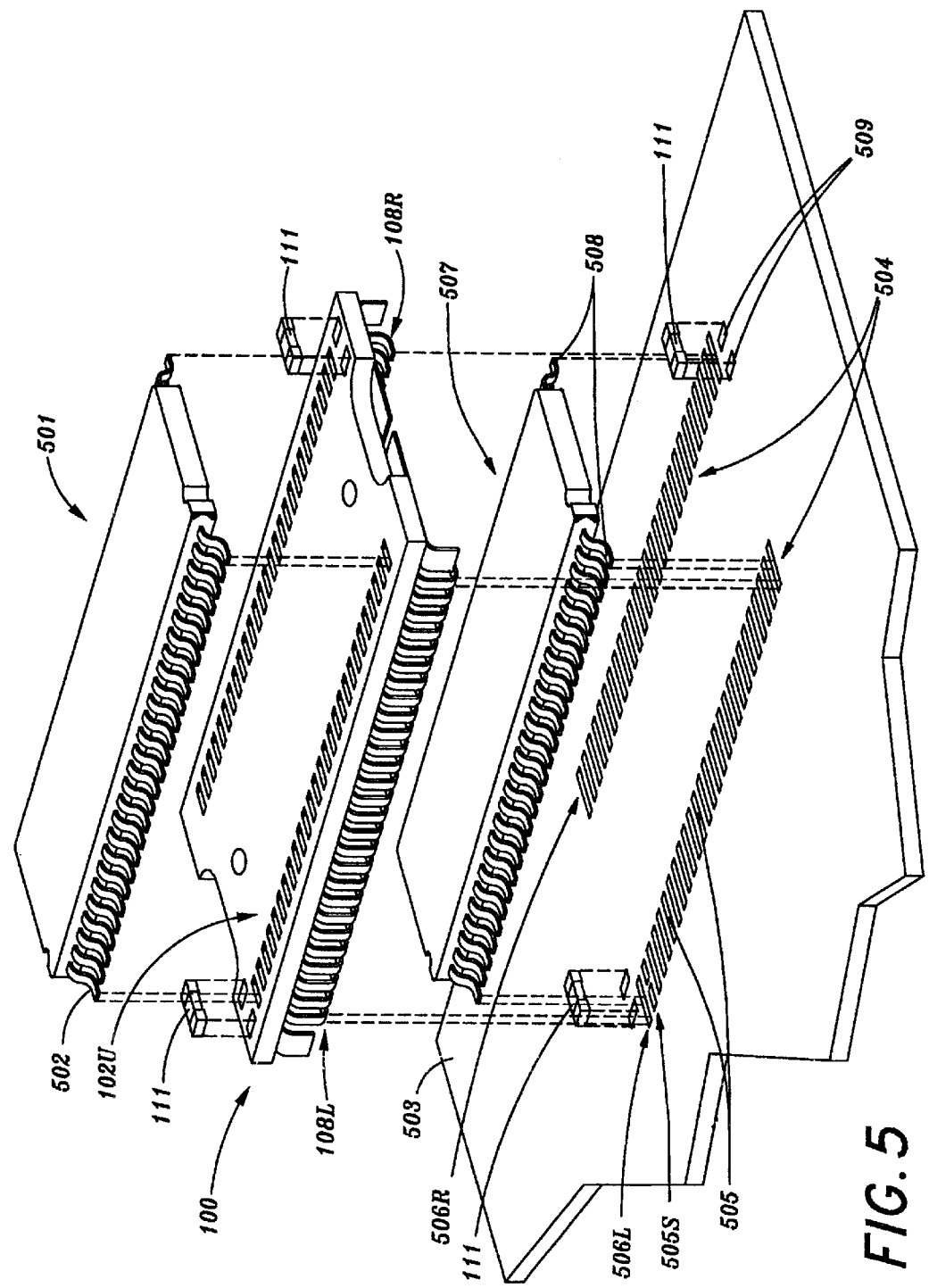
FIG. 5 is an isometric view of an exploded portion first embodiment electronic.

Referring now to the exploded view of an electronic module 500 in FIG. 5, a first integrated circuit package 501 having a plurality of leads 502 is shown aligned for surface mounting to the first mounting pad array 103 on the upper major planar surface 102U of the first embodiment package carrier 100. A printed circuit board 503 includes a second mounting pad array 504 having individual mounting pads 505 arranged in two parallel rows 506L and 506R. A second integrated circuit package 507 having a plurality of leads 508 is shown aligned for surface mounting to the third mounting pad array 504. The package carrier 100 is also aligned for surface mounting to the third mounting pad array. The package carrier 100 is designed so that its two rows of leads 108L and 108R constituting its carrier lead set 108 are spaced wider than the rows of leads 508 on the second integrated circuit package 507. Such an arrangement permits one carrier lead 108 and one second package lead 508 to share a common mounting pad 505 on the printed circuit board 503. Where the signals and/or power inputs are common, the pad 505 need not be split. However, where the signals are different (e.g., chip select signals), then the pad 505 may be split so that a different signal or power requirement may be delivered to the proper lead. Pad 505S is such a split pad. If both the first and second packages 501 and 507, respectively, are memory chips and the first package 501 is surface mounted to the carrier 100 and the carrier 100 and the second package are surface mounted to the printed circuit board 503, then each chip may be individually selected by sending a signal to the appropriate half of pad 505S. An alternative method of routing chip select signals to two identical chips involves utilizing a pad for an unused lead (of which there are typically several on each package) for one of the chip select signals and then rerouting the signal within the carrier body 101 to the pad where the chip select lead will be bonded. It will be noted that the printed circuit board includes a pair of capacitor mounting pads 509 at opposite corners of the third mounting pad array 504. The pads of each pair are sized and spaced to receive a surface mount decoupling capacitor 111. Additionally, more than two capacitors for each chip may be employed. It should be evident that for a pair of identical memory chips, all connections, other than the chip select input, will be vertically superimposed. In such a case, the internally-plated apertures 107 will be used to interconnect a pad 104 of the first mounting pad array 103 with a vertically-aligned pad 106 of the second mounting pad array 105. When dissimilar first and second integrated circuit packages are employed, rerouting of the connections may be necessary. This may be accomplished in the same manner as used for printed circuit board design. Thus, between the first and second mounting pad arrays which are respectively located on the upper 102U and lower 102L surfaces of the carrier body 101, one or more intervening layers of traces are embedded within the dielectric material of the body 101. The intervening layers may also be interconnected with internally plated apertures.

Figure 6:
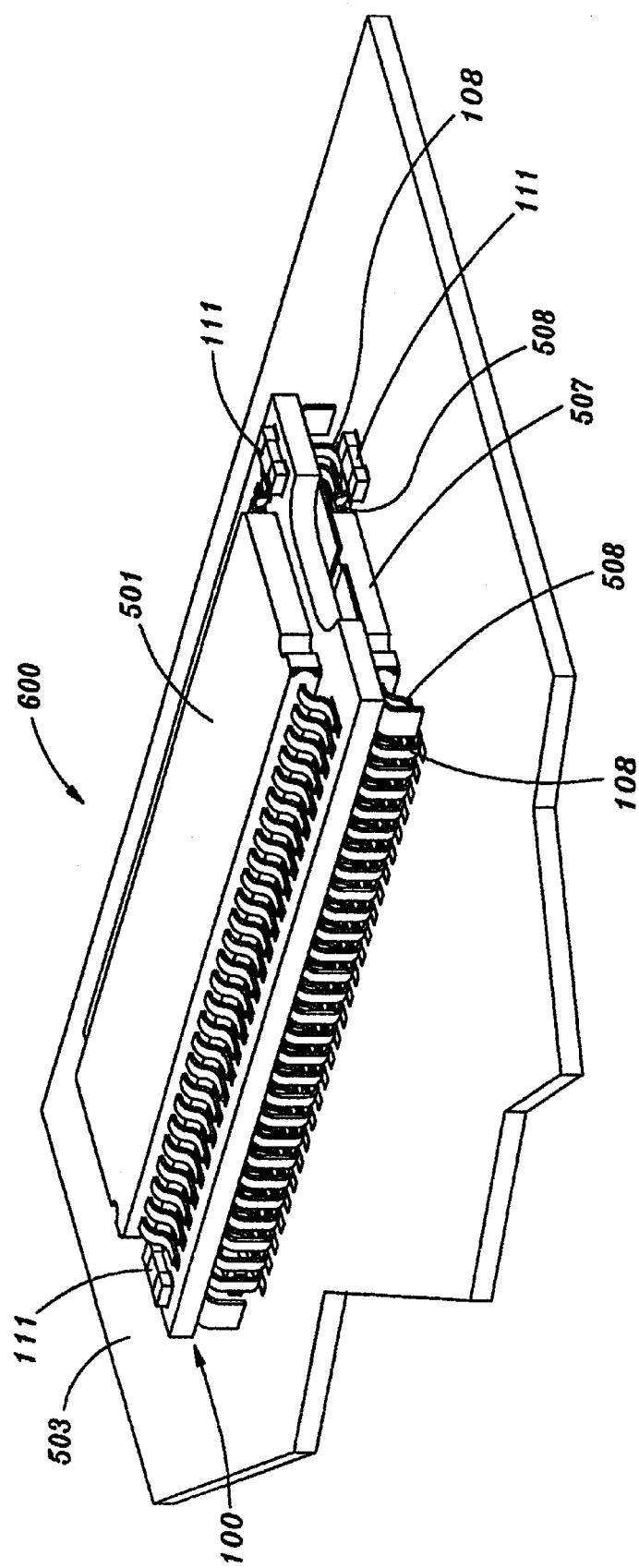
FIG. 6 is an isometric view of an assembled portion of the first embodiment electronic module.

Referring now to FIG. 6, the second integrated circuit package 507 is surface mounted to a third mounting pad array 504 on the printed circuit board 503, the first embodiment package carrier 100 is also surface mounted to the third mounting pad array 504, and the first integrated circuit package 501 is surface mounted to the first mounting pad array 103 of the package carrier 100. The assembly also includes four decoupling capacitors 111 which are surface mounted to capacitor mounting pads 110 on carrier 100 and 509 on printed circuit board 503.

Figure 7:
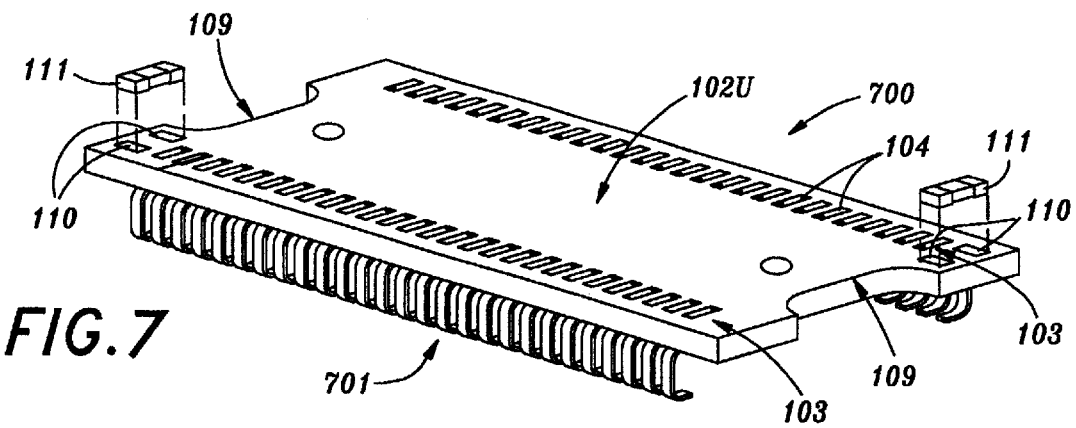
FIG. 7 is an isometric view of a second embodiment package carrier.
Figure 8:
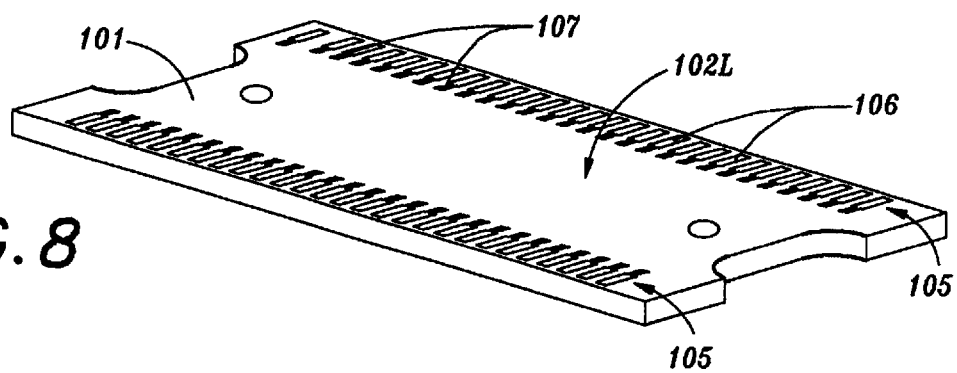
FIG. 8 is an isometric view of the second embodiment package carrier body, showing the underside thereof.
Figure 9:
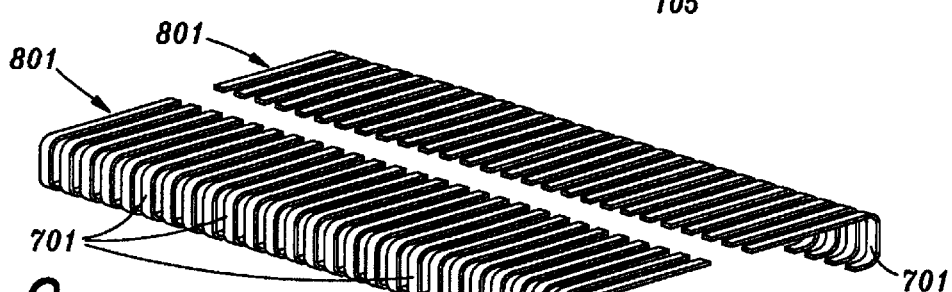
FIG. 9 is an isometric view of the carrier leads of the package carrier of FIG. 7.

FIGS. 7, 8 and 9 show a second embodiment package carrier 700 in both assembled form (FIG. 7) and component form (FIGS. 8 and 9). The principal difference between the first embodiment carrier 100 and the second embodiment carrier 700 is the shape of the leads 701. It will be noted that each lead has an elongated portion which functions as a heat sink. There are no laminar sheets coupled to either the power and ground leads, as is the case for the first embodiment carrier 100. FIG. 8 shows the under side of the dielectric carrier body 101 which, in this case, is identical to that of the first embodiment carrier 100.

Figure 10:
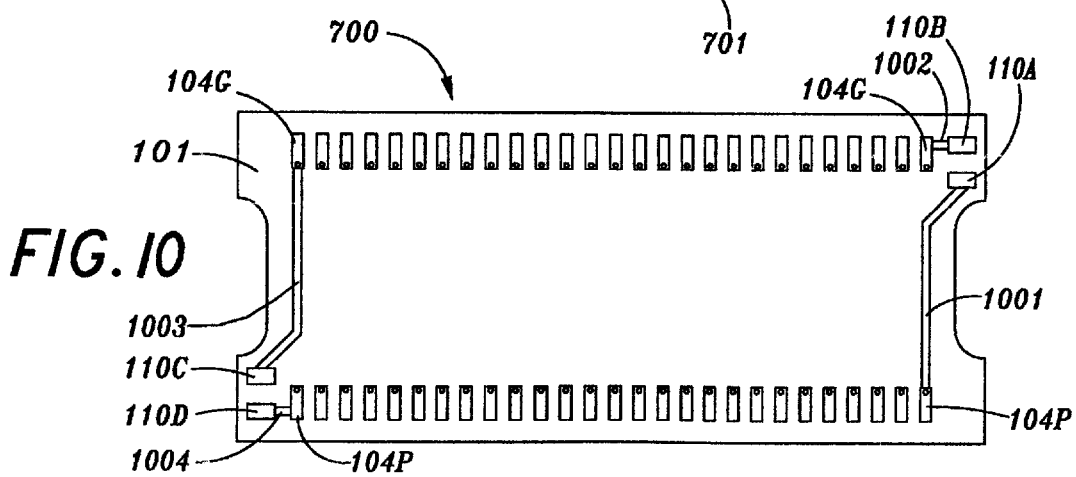
FIG. 10 is a top plan view of a carrier body of either the first or second embodiment package carrier.

Referring now to FIG. 10, a top view of the body of either the first or second chip carrier 700 shows one configuration for the routing of traces for the decoupling capacitor mounting pads 110 and 509. Trace 1001 couples pad 110A to a power mounting pad 104P of the first mounting pad array 103, while trace 1002 couples pad 110B to a ground mounting pad 104G of the first mounting pad array 103. Likewise, trace 1003 couples pad 110C to a ground mounting pad 104G of the first mounting pad array 103, while trace 1004 couples pad 110D/509D to a power mounting pad 104P of the first mounting pad array 103.

Figure 11:
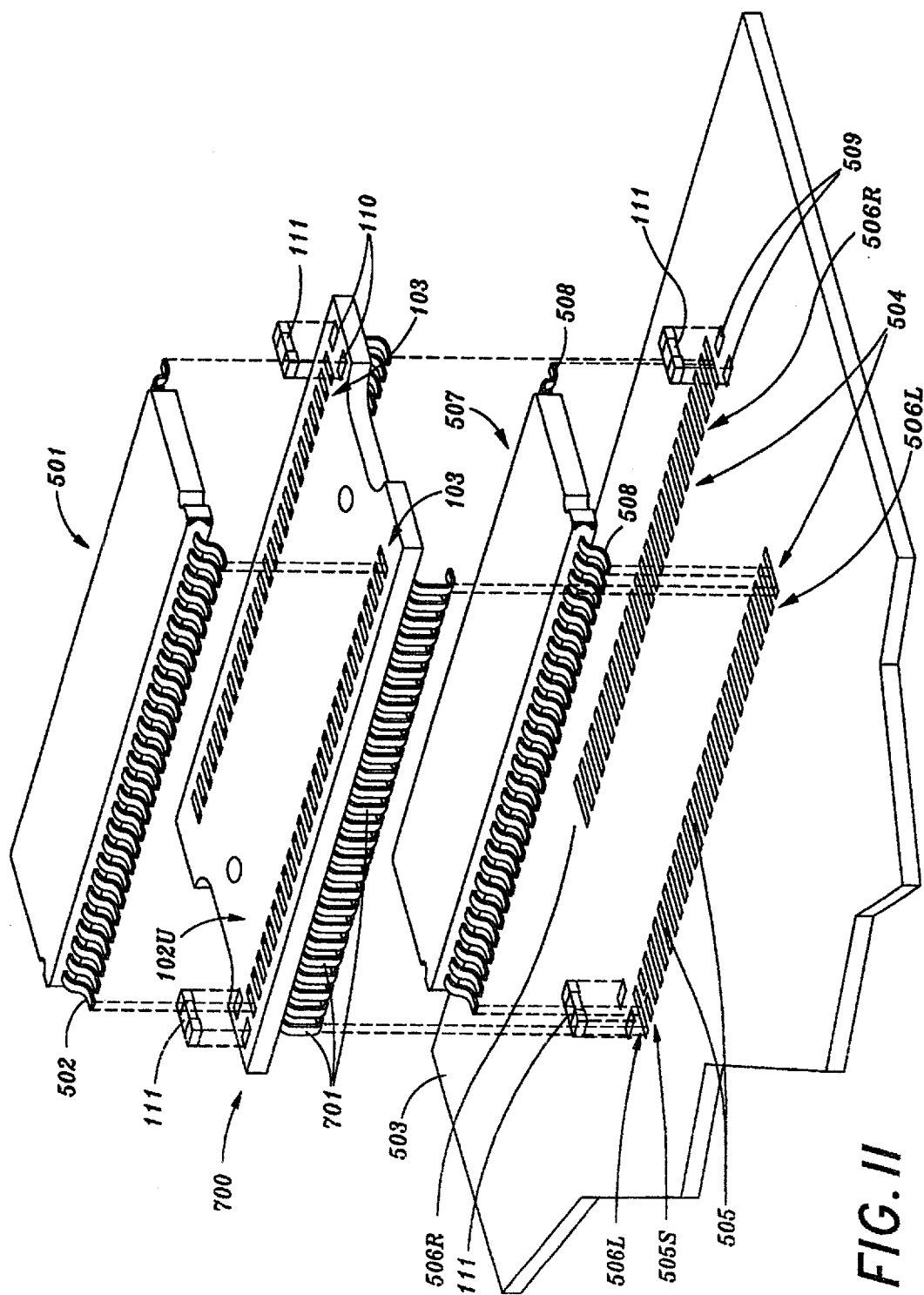
FIG. 11 is an isometric view of an exploded portion second embodiment electronic module.

Referring now to the exploded view of FIG. 11, a first integrated circuit package 501 having a plurality of leads 502 is shown aligned for surface mounting to the first mounting pad array 103 on the upper major planar surface 102U of the second embodiment package carrier 700. A printed circuit board 503 includes a third mounting pad array 504 having individual mounting pads 505 arranged in two parallel rows 506L and 506R. A second integrated circuit package 507 having a plurality of leads 508 is shown aligned for surface mounting to the third mounting pad array 504. The second embodiment package carrier 700 is also aligned for surface mounting to the third mounting pad array.

Figure 12:
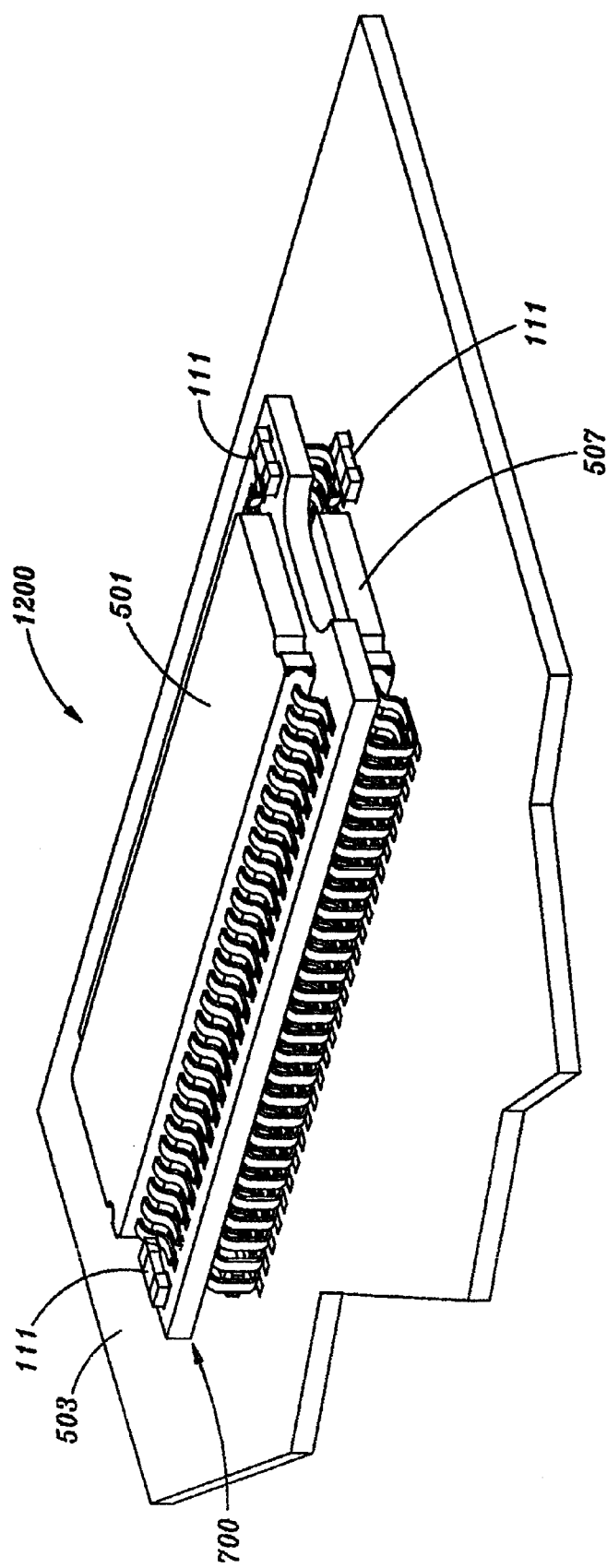
FIG. 12 is an isometric view of an assembled portion of the second embodiment electronic module.

Referring now to FIG. 12, the second integrated circuit package 507 is surface mounted to the third mounting pad array 504 on the printed circuit board 503, the second embodiment package carrier 700 is also surface mounted to the third mounting pad array 504, and the first integrated circuit package 501 is surface mounted to the first mounting pad array 103 of the package carrier 100. The assembly also includes four decoupling capacitors 111 which are surface mounted to capacitor mounting pads 110 and 509.

Although only several single embodiments of the invention have been heretofore described, it will be obvious to those having ordinary skill in the art that changes and modifications may be made thereto without departing from the scope and the spirit of the invention as hereinafter claimed. For example, many variations of two basic embodiments are possible. For example, the leads of surface mount IC packages may vary. In addition, the shape of the outer portions of the carrier leads may also vary from the "C" shape disclosed herein. At the present time, two types of leads are most commonly used for surface mount components. One lead is "J"-shaped; the other is "S"-shaped. The "S"-shaped leads are becoming increasingly widespread. Other types of leads for surface-mount components may also be developed. The invention should not be considered limited by the type of leads which are utilized on any of the constituent components or on the chip carrier 101. Lead types may also be mixed between components comprising a module. Thus, assemblies having a number of different lead combinations are possible. At one end of the spectrum, both packages and the carrier may utilize "C"-shaped or "J"-shaped leads. At the other end, all components will use "S"-shaped leads. Between those two extremes, each of the components may utilize either of the three leads currently available for surface-mount components, as well as leads which might be developed. In addition, the surface mounting of components typically involves a solder reflow process, where leads and/or mounting pads are coated with a solder emulsion. The components are then assembled and the assembly is subjected to a reflow step in an oven. The leads are thus conductively bonded to the mounting pads. There are other known techniques for bonding leads to mounting pads. Placing a metal ball (usually gold) on each of the mounting pads, placing a lead on top of each ball, and using ultrasonic energy to fuse each ball to both its associated pad and lead is another surface mount option.

What is claimed is:

1. A package carrier comprising: a dielectric body having upper and lower parallel major planar surfaces; a first mounting pad array affixed to said upper major planar surface, said first mounting pad array sized to receive the leads of a first discrete integrated circuit package adjacent to said upper major planar surface;

a second mounting pad array affixed to said lower major planar surface, each pad of said second array coupled to a pad of said first array by means of an internally plated aperture which extends between said upper major planar surface and said tower major planar surface;

a set of carrier leads, each carrier lead conductivety bonded to a pad of said second array, said set of carrier leads spaced and configured for surface mounting on a printed circuit board;

said package carrier forming a discrete unitary structure capable of being positioned on pads on a circuit board over a second integrated circuit package positioned on a printed circuit board; and a heat sink incorporated into said dielectric body and positioned on said lower major planar surface, said heat sink being a substantially flat member.

2. The package carrier of claim 1, wherein said substantially flat member is formed by a laminar extension of at least one of said carrier leads and serves as a heat sink for a second integrated circuit package which mounts between a printed circuit board and said lower major planar surface.

3. The package carrier of claim 1, wherein said substantially flat member is formed by a laminar extension on each carrier lead, which laminar extensions are parallel to and contiguous with said lower major planar surface.

4. The package carrier of claim 1 wherein said substantially flat member is a laminar extension of those carrier leads which are designated to be either at ground potential or at supply voltage potential during operation of the first integrated circuit package.

5. The package carrier of claim 2, wherein only those carrier leads which are designed to be at either ground potential or at supply voltage potential during operation of the first integrated circuit package have laminar extensions which function as heat sinks.

6. The package carrier of claim 1, which further comprises at least one pair of capacitor mounting pads on said upper major planar surface, each pair sized and spaced to receive a decoupling capacitor.

7. The package carrier of claim 1 wherein said substantially flat member is a laminar sheet.

8. The package carrier of claim 7 wherein said dielectric body includes a notch on at least one end to expose an edge of said laminar sheet.

9. The package carrier of claim 1 wherein said dielectric body includes a notch on at least one edge to expose a portion of said substantially flat member.

10. An electronic circuit module comprising:
a printed circuit board having at least one interconnection pad array affixed thereto;
at least one IC package unit, each unit having;
a) a discrete package carrier having a dielectric carrier body with upper and tower parallel major planar surfaces, a first mounting pad array affixed to said upper major planar surface, a second mounting pad array affixed to said lower major planar surface, each pad of said second mounting pad array coupled to a pad of said first array by means of an internally plated aperture which extends between said upper and lower major planar surfaces, and a set of carrier leads, each carrier lead conductively bonded to a pad of said second mounting pad array, said set of carrier leads spaced and configured for surface mounting to said at least one interconnection pad array on said printed circuit board; and
b) first and second discrete integrated circuit packages, each discrete integrated circuit package having a dielectric package body containing an integrated circuit chip and a plurality of package leads coupled to said chip and extending outwardly from said body, the leads of said first package being conductively bondable to said first mounting pad array adjacent said upper major planar surface, the leads of said second package being conductivety bondable to said at least one interconnection pad array beneath said lower major planar surface of said discrete package carrier.

11. The electronic circuit module of claim 10, wherein said carrier body is formed from a semi-rigid polymeric material.

12. The electronic circuit module of claim 10, wherein laminar extensions of said carrier leads serve as a heat sink for said second integrated circuit package which mounts between said printed circuit board and said lower major planar surface.

13. The electronic circuit module of claim 10, wherein each carrier lead includes a laminar extension which is parallel to and contiguous with said lower major planar surface.

14. The electronic circuit module of claim 10, wherein only those carrier leads which are designed to be at either ground potential or at supply voltage potential during operation of the first integrated circuit package have laminar extensions which function as heat sinks.

15. The electronic circuit module of claim 10, wherein said carrier leads are C-shaped.

16. The electronic circuit module of claim 10, wherein said package carrier further comprises at least one pair of capacitor mounting pads on said upper major planar surface, each pair sized and spaced to receive a decoupling capacitor.

17. The electronic circuit module of claim 10, wherein said dielectric carrier body is formed from fiberglass-reinforced plastic material.

18. The electronic circuit module of claim 10, wherein at least one pad of said at least one interconnection array is split so that corresponding leads of said first and second integrated circuit packages may receive unique signals.

19. The electronic circuit module of claim 10, wherein unique signals are fed to corresponding leads of said first and second integrated circuit packages by routing at least one of the signals to an unused lead position on the first package, and then rerouting the signal within the carrier body to the appropriate lead on the second package.

20. The electronic circuit module of claim 10, wherein said first and second discrete integrated circuit packages are of the same size and functionally identical.

21. The electronic circuit module of claim 10 further including a heat sink incorporated into said carrier body and positioned on said lower major planar surface.

22. The electronic circuit module of claim 21 wherein said heat sink is a laminar sheet.

23. The electronic circuit module of claim 22 wherein said carrier body includes a notch on at least one end to expose an edge of said laminar sheet.

24. The electronic circuit module of claim 21 wherein said dielectric body includes a notch on at least one edge to expose a portion of said heat sink.

25. An electronic circuit module comprising:
a printed circuit board having at least one interconnection pad array affixed thereto;
multiple IC package units, each unit having a discrete package carrier having a dielectric carrier body with upper and lower parallel major planar surfaces, a first mounting pad array affixed to said upper major planar surface, a second mounting pad array affixed to said lower major planar surface, each pad of said second mounting pad array coupled to a pad of said first array by means of an internally plated aperture which extends between said upper and tower major planar surfaces, and a set of carrier leads, each carrier lead conductively bonded to a pad of said second mounting pad array, said set of carrier leads spaced and configured for surface mounting to said at least one interconnection pad array on said printed circuit board;
each IC package unit including a first and second integrated circuit chips, said first chip being electrically couplable to said first mounting pad array adjacent said upper major planar surface of said package carrier, said second chip being electrically couplable to said at least one interconnection pad array beneath said lower major planar surface of said package carrier; and
a heat sink incorporated into said dielectric body and positioned on said tower major planar surface, said heat sink being a substantially flat member.

26. The electronic circuit module of claim 25, wherein each integrated circuit chip is encapsulated within a package having a plurality of external leads, and said first chip is coupled to said first mounting pad array via the leads of its encapsulating package, and said second chip is coupled to said interconnection pad array via the leads of its encapsulating package.

27. The electronic circuit module of claim 25, wherein said carrier body is formed from a semi-rigid polymeric material.

28. The electronic circuit module of claim 25 wherein said substantially flat member is formed by laminar extensions of said carrier leads and serve as said heat sink for said second integrated circuit chip which mounts between said printed circuit board and said lower major planar surface.

29. The electronic circuit module of claim 25 wherein said substantially flat member is a laminar extension on each carrier lead which extensions are parallel to and contiguous with said tower major planar surface.

30. The electronic circuit module of claim 25, wherein said substantially flat member is formed by laminar extensions of those carrier leads which are designed to be at either ground potential or at supply voltage potential during operation of said IC package units.

31. The electronic circuit module of claim 25, wherein said carrier leads are C-shaped.

32. The electronic circuit module of claim 25, wherein said package carrier further comprises at least one pair of capacitor mounting pads on said upper major planar surface, each pair sized and spaced to receive a decoupling capacitor.

33. The electronic circuit module of claim 25, wherein said dielectric carrier body is formed from fiberglass-reinforced plastic material.

34. The electronic circuit module of claim 25, wherein at least one pad of said interconnection array is split so that corresponding leads of said first and second packages may receive unique signals.

35. The electronic circuit module of claim 25, wherein unique signals are fed to corresponding leads of said first and second packages by routing at least one of the signals to an unused lead position on the first package, and then rerouting the signal within the carrier body to the appropriate lead on the second package.

36. The electronic circuit module of claim 25 wherein said substantially flat member is a laminar sheet.

37. The electronic circuit module claim 36 wherein said carrier body includes a notch on at least one end to expose an edge of said laminar sheet.

38. The electronic circuit module of claim 25 wherein said carrier body includes a notch on at least one edge to expose a portion of said substantially flat member.

39. A package carrier comprising: a rigid body having upper and lower parallel major planar surfaces; a first mounting pad array affixed to said upper major planar surface, said first mounting pad array sized to receive the leads of a first integrated circuit package;
a second mounting pad array affixed to said lower major planar surface, each pad of said second array coupled to a pad of said first array by means of an internally plated aperture which extends between said upper major planar surface and said lower major surface;

a set of carrier leads, each carrier lead conductively bonded to a pad of said second array, said set of carrier leads spaced and configured for surface mounting on a printed circuit board;

said package carrier forming a discrete unitary structure capable of being positioned on pads on a circuit board over a second discrete integrated circuit package positioned on a printed circuit board; and a heat sink incorporated into said carrier body, said heat sink being positioned on said lower major planar surface and formed by a substantially flat member.

40. The package carrier of claim 39 wherein said rigid body of said carrier is composed of a dielectric material.

41. The package carrier of claim 39 wherein said substantially flat member is formed by laminar extensions of said carrier leads, and serve as a heat sink for a second integrated circuit package which mounts between a printed circuit board and said lower major planar surface.

42. The package carrier of claim 39, wherein said heat sink disipates heat for a second integrated circuit package which mounts between a printed circuit board and said lower major planar surface.

43. The package carrier of claim 39, wherein said substantially flat member is formed by laminar extensions of carrier leads which are designed to be at either ground potential or at supply voltage potential during operation of a first integrated circuit package positioned on first mounting pad array.

44. The package carrier of claim 39, which further comprises at least one pair of capacitor mounting pads on said upper major planar surface, each pair sized and spaced to receive a decoupling capacitor.

45. The package carrier of claim 39, wherein said heat sink is a laminar sheet.

46. The package carrier of claim 45 wherein said carrier body includes a notch on at least one end to expose an edge of said laminar sheet.

47. The package carrier of claim 39 wherein said carrier body includes a notch on at least one end to expose an edge of said substantially flat member.

* * * * *